(12) United States Patent
Cho et al.

(10) Patent No.: US 9,064,597 B2
(45) Date of Patent: Jun. 23, 2015

(54) MEMORY SEMICONDUCTOR DEVICE AND METHOD OF OPERATING THE SAME

(71) Applicant: Samsung Electronics Co., Ltd., Suwon-Si, Gyeonggi-Do (KR)

(72) Inventors: Byungkyu Cho, Seoul (KR); Changyun Lee, Suwon-Si (KR); Sunghoi Hur, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/159,369

(22) Filed: Jan. 20, 2014

(65) Prior Publication Data

US 2014/0133223 A1    May 15, 2014

Related U.S. Application Data

(62) Division of application No. 13/107,206, filed on May 13, 2011, now Pat. No. 8,644,064.

(30) Foreign Application Priority Data

May 24, 2010  (KR) .................. 10-2010-0048194

(51) Int. Cl.
| G11C 16/04 | (2006.01) |
| G11C 16/34 | (2006.01) |
| G11C 16/26 | (2006.01) |

(52) U.S. Cl.
CPC ........ *G11C 16/3427* (2013.01); *G11C 16/0483* (2013.01); *G11C 16/26* (2013.01)

(58) Field of Classification Search
CPC .................................................. G11C 16/0483
USPC ........................................................ 365/185.02
See application file for complete search history.

(56) References Cited

U.S. PATENT DOCUMENTS

| 7,440,331 B2 * | 10/2008 | Hemink ................... 365/185.22 |
| 2005/0254302 A1 | 11/2005 | Noguchi |
| 2007/0279993 A1 | 12/2007 | Hemink |
| 2007/0279995 A1 | 12/2007 | Mokhlesi et al. |
| 2008/0101122 A1 | 5/2008 | Kang et al. |
| 2008/0135912 A1 | 6/2008 | Lee et al. |
| 2008/0253183 A1 * | 10/2008 | Mizukami et al. ........ 365/185.05 |
| 2009/0238003 A1 * | 9/2009 | Namiki et al. ........... 365/185.17 |
| 2010/0052017 A1 | 3/2010 | Sato et al. |
| 2010/0067299 A1 | 3/2010 | Futatsuyama |
| 2011/0075483 A1 | 3/2011 | Morikado |
| 2012/0250414 A1 | 10/2012 | Khandelwal et al. |

FOREIGN PATENT DOCUMENTS

| KR | 1020090019195 | * | 2/2009 |
| KR | 1020090028483 | * | 3/2009 |

* cited by examiner

*Primary Examiner* — Hoai V Ho
*Assistant Examiner* — Jay Radke
(74) *Attorney, Agent, or Firm* — F. Chau & Associates, LLC

(57) ABSTRACT

In a read step or a program (write) verification step of a semiconductor memory device, read voltages different from one another are applied to a pair of word lines respectively disposed on both sides of a selected word line to suppress the enlargement of program distribution.

5 Claims, 19 Drawing Sheets

MEMORY SEMICONDUCTOR DEVICE AND METHOD OF OPERATING THE SAME

CROSS-REFERENCE TO RELATED APPLICATION

This Application is a divisional application of U.S. non-provisional patent application Ser. No. 13/107,206, filed on May 13, 2011, which claims under 35 U.S.C. §119 priority to and the benefit of Korean Patent Application No. 10-2010-0048194, filed on May 24, 2010, the entire content of each of which is incorporated by reference herein.

BACKGROUND

The present disclosure relates to a semiconductor device, and more particularly, to a memory semiconductor device and a method of operating the same.

In the memory semiconductor technology field, data distribution may affect speed, life and reliability of product. In particular, in a multi-level cell (MLC) in which one memory cell can have one state of multiple data states (e.g., voltage levels), data distribution is an important factor because of the importance of separation between data states. A reduction in the voltage margin separating voltage levels in the MLC that yield the desired bit information can result in the possibility of more errors.

As the integration of memory semiconductors increases, control of such data distribution is becoming increasingly difficult. Regarding technology for suppressing short channel effect, methods of reducing an impurity concentration of source/drain regions of metal-oxide-semiconductor field-effect transistors (MOSFETs) have been suggested. However, those methods can affect data distribution since impurity concentrations of one MLC can affect voltage levels of adjacent MLCs in memory strings of a memory cell array.

SUMMARY

An exemplary embodiment of the inventive concept provides a method of operating a semiconductor device. The semiconductor device includes at least one string having first and second impurity regions and memory cells serially connected between the first and second impurity regions. The memory cells include a left adjacent cell and a right adjacent cell disposed on the left and right side, respectively, of one of memory cells selected as a target cell in a cell selecting step. A source/drain region of at least one of the serially connected memory cells is different from at least one of the first and second impurity regions in at least one of a conductivity type and an impurity concentration. A first voltage that is a maximum voltage among voltages applied to gates of the memory cells is applied to a gate of the right adjacent cell during the cell selecting step.

The method may further include applying to a gate of the left adjacent cell during the cell selecting step a second voltage that is a minimum voltage among voltages applied to gates of the memory cells.

The method may further include during the cell selecting step applying to at least one of gates of memory cells disposed between the first impurity region and the left adjacent cell and between the second impurity region and the right adjacent cell, a third voltage that has a voltage level between the first voltage and the second voltage.

The first, second and third voltages may be greater than a threshold voltage of memory cell in a programmed state and may be smaller than a minimum voltage required to change data of memory cell in an erasure state.

During the cell selecting step, the second voltage may be commonly applied to the gate of the left adjacent cell and at least one of gates of the memory cells disposed between the first impurity region and the left adjacent cell.

During the cell selecting step, the first voltage may be commonly applied to the gate of the right adjacent cell and at least one of gates of the memory cells disposed between the second impurity region and the right adjacent cell.

During the cell selecting step, a gate of the target cell may be coupled to a voltage smaller than a threshold voltage of memory cell of a programmed state.

The semiconductor device may further include a common source line connected to the first impurity region and a bit line connected to the second impurity region. The left adjacent cell is one that is most adjacent (proximal) to the target cell among memory cells between the target cell and the first impurity region, and the right adjacent cell is one that is most adjacent (proximal) to the target cell among memory cells between the target cell and the second impurity region.

The source/drain region of the serially connected memory cells may have an impurity concentration lower than the first and second impurity regions.

The method of operating the semiconductor device may further include performing read and program verifying operations of reading data stored in one of the memory cells of the string, the read operation and the program verification operation being performed using the cell selecting step.

The semiconductor device may further include a substrate, the distances between the bottom surface of a substrate and the memory cells is different from memory cell to memory cell within a string.

According to an exemplary embodiment of the inventive concept a semiconductor device includes at least one string including first and second impurity regions and memory cells serially connected between the first and second impurity regions, a voltage generator configured to generate operation voltages, and a coupler configured to electrically connect the memory cells and the voltage generator. A source/drain region of at least one of the serially connected memory cells is different from at least one of the first and second impurity regions in at least one of a conductivity type and an impurity concentration. During a cell selecting step one of the memory cells is selected as a target cell and the voltage generator and the coupler are configured to apply different voltages to gates of memory cells adjacent to the left and right sides of the target cell.

The semiconductor device may further include a common source line connected to the first impurity region and a bit line connected to the second impurity region. The memory cells may include a left adjacent cell that is proximal to the target cell between the target cell and the first impurity region, and a right adjacent cell that is proximal to the target cell between the target cell and the second impurity region. During the cell selecting step, the voltage generator and the coupler may be configured to apply a first voltage that is a maximum voltage level among voltages applied to gates of the memory cells, to the right adjacent cell.

During the cell selecting step, the voltage generator and the coupler may be configured to apply a second voltage that is a minimum voltage level among voltages applied to gates of the memory cells, to the left adjacent cell.

During the cell selecting step, the voltage generator and the coupler may be configured to apply a third voltage that is a voltage level between the first and second voltages, to at least one of gates of memory cells disposed between the first impurity region and the left adjacent cell and between the second impurity region and the right adjacent cell.

During the cell selecting step, the voltage generator and the coupler may be configured to apply the second voltage to at least one of gates of memory cells disposed between the first impurity region and the left adjacent cell and to a gate of the left adjacent cell.

During the cell selecting step, the voltage generator and the coupler may be configured to apply the first voltage to at least one of gates of memory cells disposed between the second impurity region and the right adjacent cell and to a gate of the right adjacent cell.

The source/drain region of the serially connected memory cells may have an impurity concentration lower than the first and second impurity regions.

The semiconductor device may further include a substrate, the distances between the bottom surface of a substrate and the memory cells is different from memory cell to memory cell within a string.

According to an exemplary embodiment of the present invention a method of suppressing storage induced barrier charge coupling in a semiconductor memory device having a target memory cell in a memory string, the memory string having a first memory cell adjacent to one side of the target memory cell and a second memory cell adjacent to an other side of the target memory cell, the target memory cell being a selected memory cell during a read operation, is provided. Voltage applied to a gate of the first memory cell is increased relative to a voltage applied to unselected memory cells during the read operation and voltage applied to the gate of the second memory cell is decreased relative to the voltage applied to the gate of unselected memory cells during the read operation such that storage induced barrier charge coupling between the target memory cell and the first memory cell is suppressed.

BRIEF DESCRIPTION OF THE DRAWINGS

The accompanying drawings, together with the description hereinbelow, explain the exemplary embodiments of the inventive concept.

DETAILED DESCRIPTION

Figure 1:
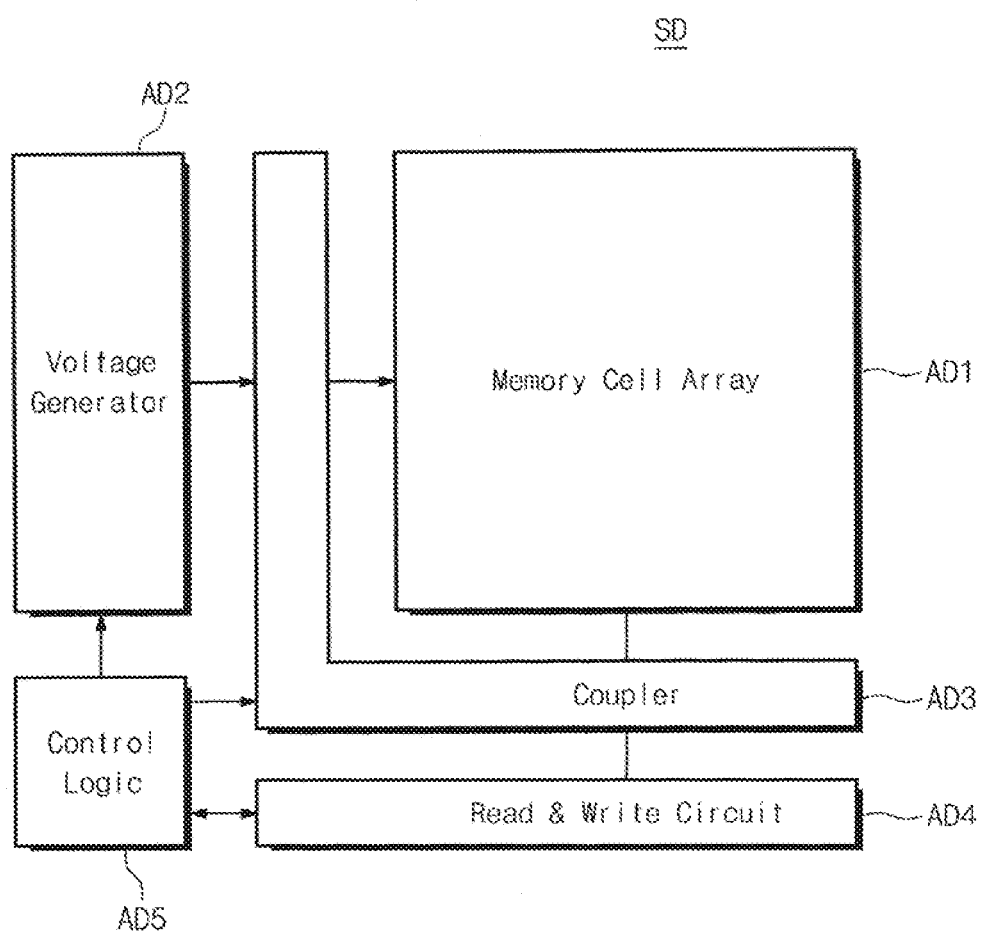
FIG. 1 is a block diagram illustrating a semiconductor device in accordance with exemplary embodiments of the inventive concept.

The exemplary embodiments of the inventive concept described hereinbelow may, in addition, be embodied in different forms and should not be construed as limited to the exemplary embodiments set forth herein. Like numbers refer to like elements throughout.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

FIG. 1 is a block diagram illustrating a semiconductor device in accordance with an exemplary embodiment of the inventive concept.

Referring to FIG. 1, a semiconductor device SD may include a memory cell array AD1, a signal (e.g., voltage) generator AD2, a coupler AD3, a read and write circuit AD4 and a control logic AD5.

Figure 2:
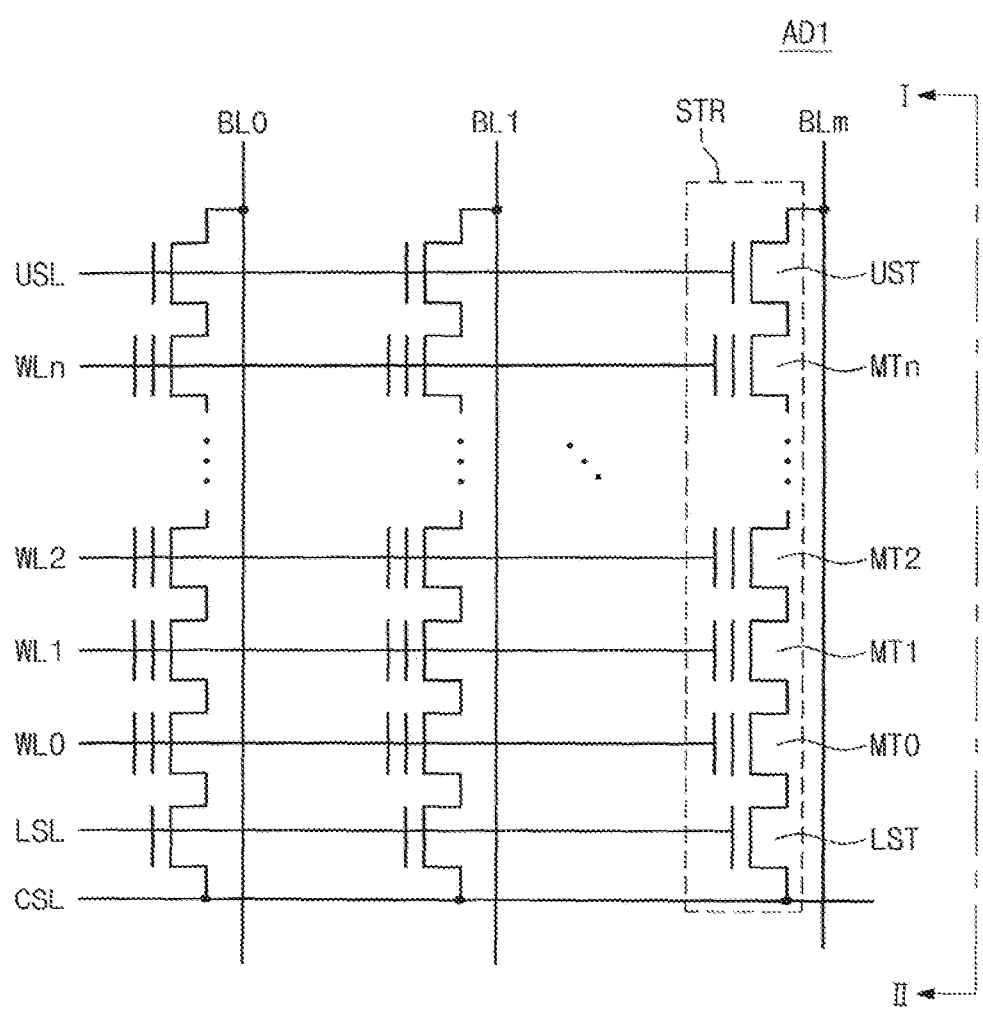
FIG. 2 is a circuit diagram illustrating a cell array of a semiconductor device in accordance with an exemplary embodiment of the inventive concept.

The memory cell array AD1 may include a plurality of cells arranged in two or three dimensions and have an interconnection structure providing an electrical or optical connection path for accessing the cells. According to an exemplary embodiment, the memory cells may store data. For example, the cells may be a charge storage memory element such as in a flash memory device or may be a variable resistance memory element such as in a phase-change random access memory (PRAM), a resistive random access memory (RRAM) and a magnetoresistive random access memory (MRAM). The interconnection structure may include conductive lines that form a plurality of word lines and a plurality of bit lines. The memory cells and the interconnection structure in the memory cell array AD1 may be arranged so as to provide a NAND array structure as illustrated in FIG. 2. Alternatively, the memory cells and interconnection structure may be arranged so as to provide other structures (e.g., a NOR circuit or an AND circuit).

The signal/voltage generator AD2 may be controlled by the control logic AD5 and may be configured to generate various electrical or optical signals needed for an operation of the memory cell. For example, in the case where the semiconductor device SD is a NAND type memory device, the signal generator AD2 may be configured to generate various voltages.

The coupler AD3 may be configured to connect the signal generator AD2 to the interconnection structure. More specifically, the coupler AD3 may be configured to select at least one of multiple interconnections forming the interconnection structure on the basis of address information transferred from the control logic AD5. In this aspect, the coupler AD3 can function as a decoding circuit. In addition, the coupler AD3 may be configured to selectively apply signals generated from the signal generator AD2 to the interconnection structure or some interconnections selected from the interconnection structure. In this aspect, the coupler AD3 can function as a driving circuit.

The read and write circuit AD4 may be configured to write data in a portion of the memory cell array AD1 or to read data from a portion of the memory cell array AD1, and may be controlled by the control logic AD5. According to an exemplary embodiment, the read and write circuit AD4 may be disposed between the coupler AD3 and the memory cell array AD1.

Figure 3:
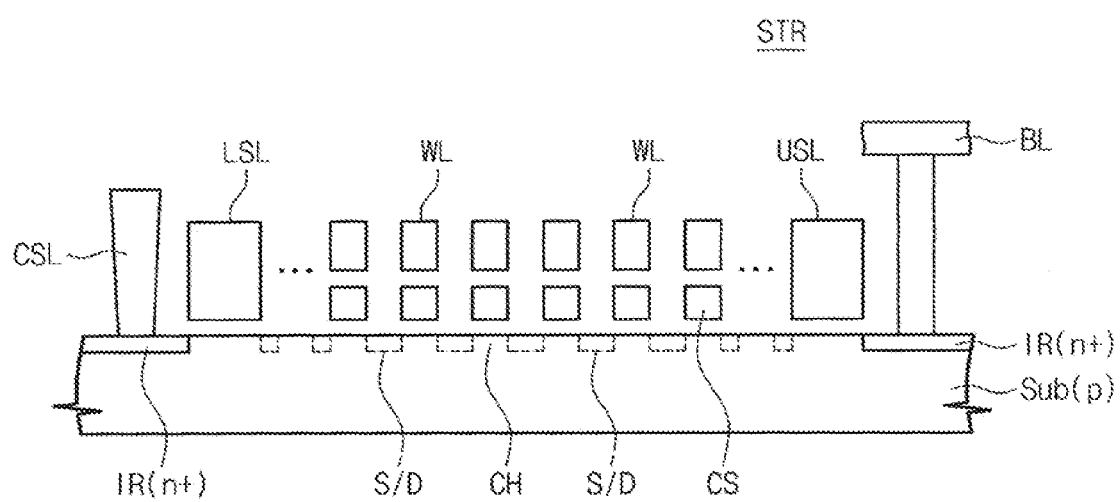
FIG. 3 is a cross-sectional view, taken along lines I-II in FIG. 2, illustrating a string of a semiconductor device in accordance with an exemplary embodiment of the inventive concept.

FIG. 2 is a circuit diagram illustrating a memory cell array AD1 of a semiconductor device in accordance with an exemplary embodiment of the inventive concept. FIG. 3 is a cross-sectional view illustrating a string STR of a semiconductor device in accordance with an exemplary embodiment of the inventive concept.

Referring to FIG. 2, the memory cell array AD1 in accordance with the present embodiment may include a plurality of strings STR forming a NAND type memory cell array structure and each of the strings STR may include at least one upper select transistor UST, at least one lower select transistor LST and a plurality of memory cell transistors MT0-MTn serially connected between the UST and the LST.

Each of the upper select transistors UST is connected to one of bit lines BL0-BLm. Each of the lower select transistors LST is commonly connected to the common source line CSL. Gate electrodes of the upper and lower select transistors UST, LST are respectively connected to an upper select line USL and a lower select line LSL crossing the bit lines BL0-BLm, and gate electrodes of the memory cell transistors MT0-MTn are connected to word lines WL0-WLn crossing the bit lines BL0-BLm between the upper and lower select lines USL, LSL.

Referring to FIG. 3, the upper and lower select transistors UST, LST and the memory cell transistors MT0-MTn may be metal-oxide-semiconductor field-effect transistors (MOSFETs) integrated in a semiconductor substrate Sub. According to an exemplary embodiment, the memory cell transistors MT0-MTn may include a word line WL used as a control gate electrode and a charge storage substance CS that is interposed between the word line WL and a top surface of the semiconductor substrate Sub. The charge storage substance CS may include a conductive pattern (e.g., a floating gate electrode) electrically isolated by insulating materials or a thin layer (e.g., a silicon nitride layer) having many trap sites that are able to hold tunneling electrons from source/drain regions.

Each of the strings STR may include a pair of impurity regions IR, wherein each impurity region of the pair of impurity regions is formed on a respective end side of the corresponding string STR. The impurity regions IR have a different conductivity type than the semiconductor substrate Sub. For example, as illustrated, in the case where the semiconductor substrate Sub has a P-type, the impurity regions IR may have an N-type. One of the impurity regions IR is connected to the common source line CSL and the other may be electrically connected to one of the bit lines BL.

Figure 4A:
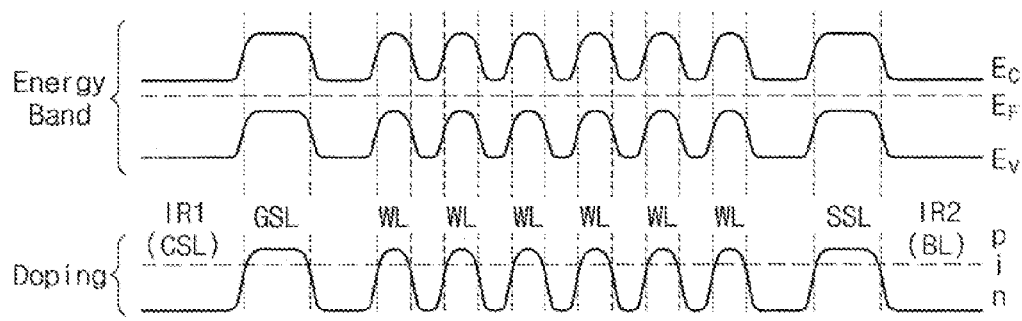
FIGS. 4A, 4B, 4C, 4D, 4E and 4F are diagrams illustrating doping profiles of a string of a semiconductor device in accordance with exemplary embodiments of the inventive concept.

The semiconductor substrate Sub may include a plurality of source/drain regions S/D separated from each other by channel regions CH. The source/drain regions S/D may be disposed between the word lines WL, between the word line WL and the lower select line LSL and between the word line WL and the upper select line USL. That is, the channel regions CH and the source/drain regions S/D may be sequentially and alternately arranged between the impurity regions IR. According to an exemplary embodiment, as illustrated in FIG. 4A, the source/drain regions S/D may have the same conductivity type as the impurity regions IR and may have the same impurity concentration as the impurity regions IR.

Figure 4B:
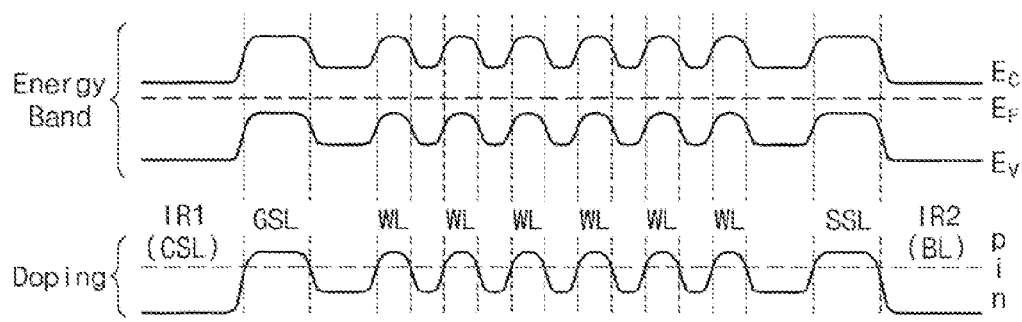
Figure 4C:
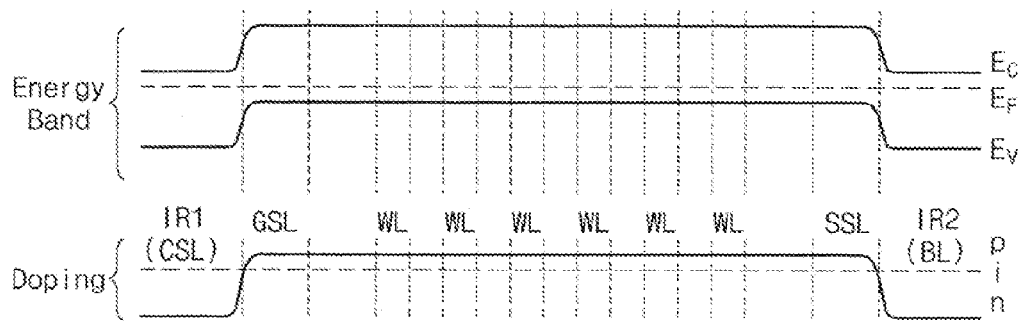
Figure 4D:
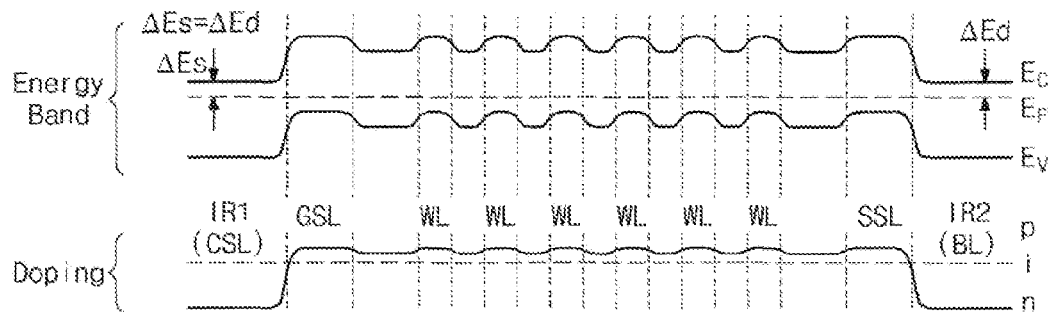
Figure 4E:
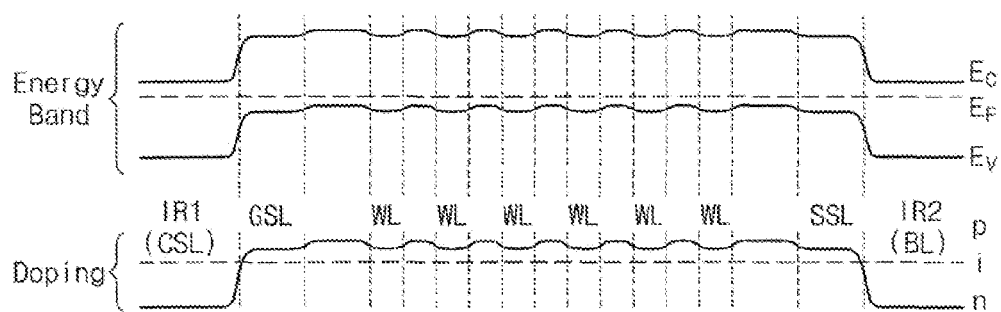

According to other embodiments of the inventive concept, the source/drain regions S/D may be different from the impurity regions IR in at least one of a conductivity type and an impurity concentration. For example, as illustrated in FIG. 4B, the source/drain regions S/D may have the same conductivity type as the impurity regions IR but may have an impurity concentration lower than the impurity regions IR. As illustrated in FIG. 4C, the source/drain regions S/D may be formed to have the substantially same impurity concentration and conductivity type as the channel regions CH. As illustrated in FIG. 4D, the source/drain regions S/D may have the same conductivity type as the channel regions CH but may have an impurity concentration lower than the channel regions CH. As illustrated in FIG. 4E, the source/drain regions S/D may have the same conductivity type as the channel regions CH but may have an impurity concentration higher than the channel regions CH.

Figure 4F:
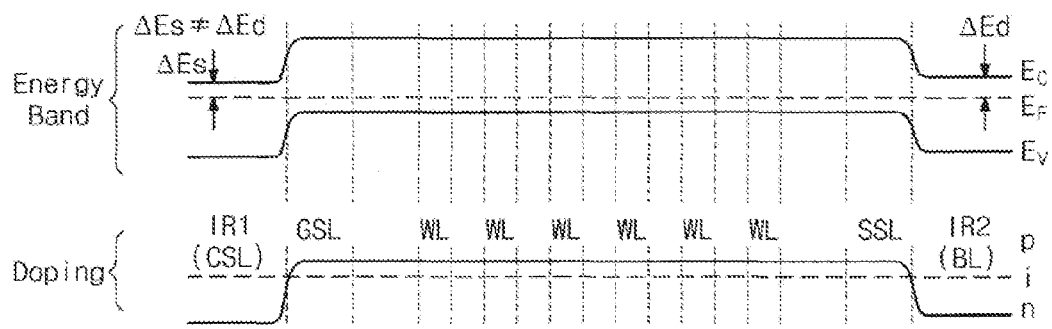

According to an exemplary embodiment, as illustrated in FIG. 4F, the pair of impurity regions IR forming one string STR may be formed to have a different impurity concentration from each other. For example, in the case where the memory cell array AD1 includes memory cells three-dimensionally arranged to be described with reference to FIG. 22, the impurity regions IR forming one string STR may not be formed at the same time. In this case, a doping profile illustrated in FIG. 4F may be obtained.

The doping profiles of a string to which an exemplary embodiment of the inventive concept can be applied have been described with reference to FIGS. 4A through 4F. However, the exemplary embodiments are not limited to those described herein, but may be applied to semiconductor devices having various different doping profiles. That is, even if such different doping profiles provide different degrees of effectiveness, exemplary embodiments of the inventive concept can still provide a desired improved effect in semiconductor devices when using such various different doping profiles.

Figure 5:
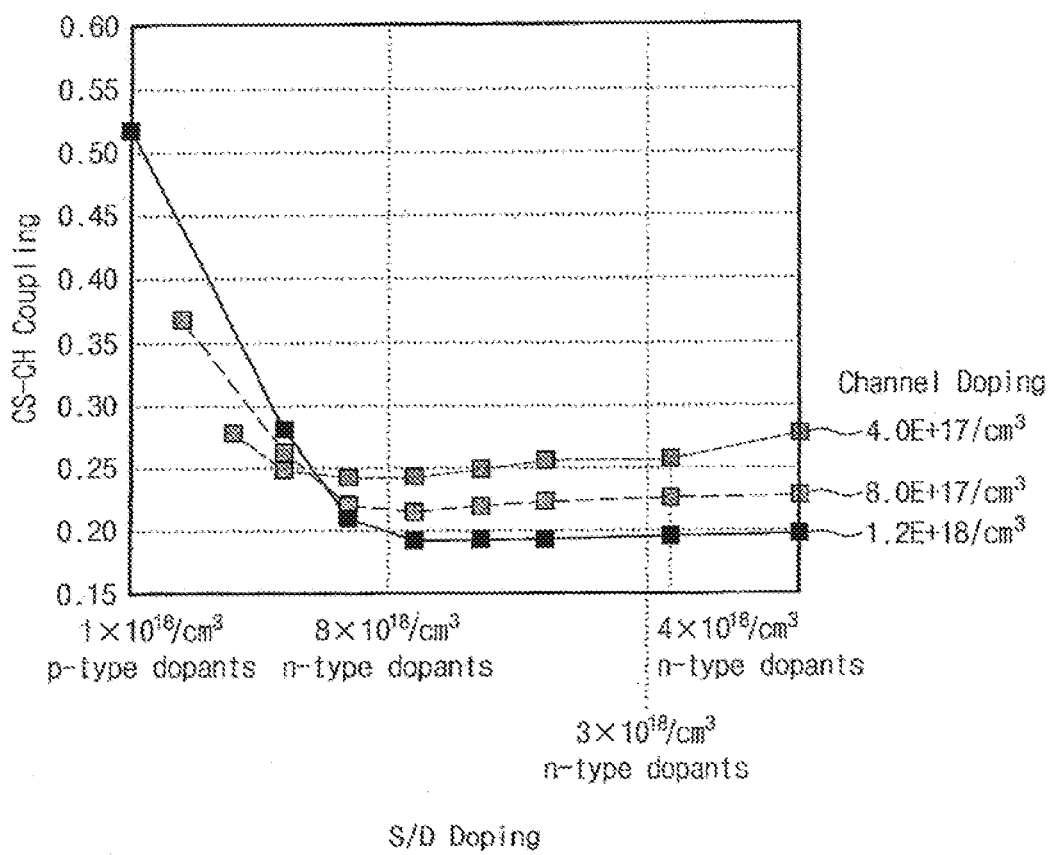
FIG. 5 is a graph showing a computer simulation result of an effect on a coupling ratio between a charge storage substance and a channel in accordance with an impurity concentration of source/drain region.

FIG. 5 is a graph showing a computer simulation result of an effect on a coupling ratio between a charge storage substance CS and a channel region CH in accordance with various impurity concentrations of source/drain region S/D. In a simulation, it is assumed that the channel is doped with a P-type impurity (boron) and an impurity concentration of the channel is split into three different values (4.0e+17/cm$^3$, 8.0e+17/cm$^3$, 1.2e+18/cm$^3$). An impurity concentration of the source/drain region S/D is split into various values between 1×10$^{18}$/cm$^3$ (P-type) and 4×10$^{18}$/cm$^3$ (N-type). In an exemplary embodiment a threshold voltage of the corresponding memory cell is 0.6V.

Referring to FIG. 5, in the case where an impurity concentration of the source/drain region S/D has a different conductivity type than the channel region CH, a coupling (hereinafter it is referred to as CS-CH coupling) between the charge storage substance CS and the channel region CH is about between 0.2 and 0.3. The doping profile illustrated in FIG. 4A corresponds to this case. However, as an impurity concentration of the source/drain region S/D becomes low, the CS-CH coupling rapidly increases to have 0.3 or more. The doping profiles illustrated in FIGS. 4B through 4F correspond to this case. In particular, in the case (referring to the most left point in the graph) that an impurity concentration of the channel increases and an impurity concentration of the source/drain region S/D has the same conductivity type as the channel region CH, the CS-CH coupling increases to about 0.52. The doping profiles illustrated in FIGS. 4C through 4F correspond to this case.

Consequently, according to a simulation result illustrated through FIG. 5, as an impurity concentration of the source/drain region S/D becomes low, the CS-CH coupling increases.

Figure 6:
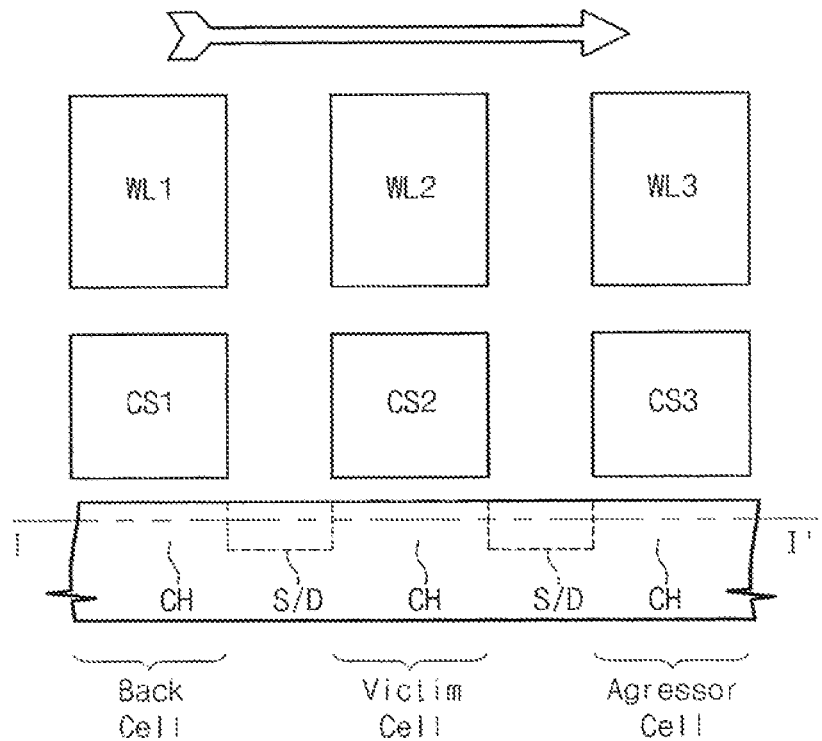
FIG. 6 is a cross-sectional view illustrating a portion of cell array of a semiconductor device in accordance with an exemplary embodiment of the inventive concept.
Figure 7:
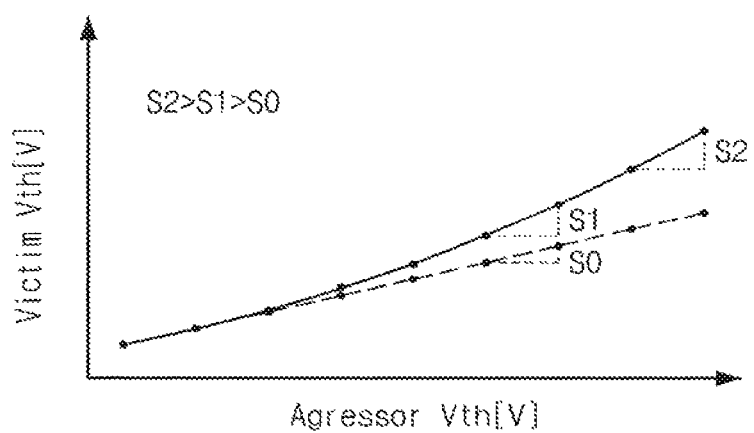
FIG. 7 is a graph for explaining one aspect of a semiconductor device in accordance with an exemplary embodiment of the inventive concept.

FIG. 6 is a cross-sectional view illustrating a portion of memory cell array of a semiconductor device in accordance with an exemplary embodiment of the inventive concept. FIG. 7 is a graph for explaining one aspect of a semiconductor device in accordance with an exemplary embodiment of the inventive concept.

Referring to FIG. 6, three memory cells forming a string sequentially arranged may be called a back cell, a victim cell and an aggressor cell, respectively. That is, in the case where a predetermined memory cell is called a victim cell and a program (write) operation is sequentially performed along a direction indicated by an arrow, cells adjacent to both sides of the victim cell may be called an aggressor cell and a back cell. A threshold voltage of the victim cell (on which a program operation is performed in advance) may become different according to a quantity of charges being injected into a charge storage substance of the aggressor cell or a voltage applied to the aggressor cell (on which a subsequent program operation is performed). The names of the cell come from the participants of the differing threshold voltage phenomenon.

Conventionally, a prediction of a threshold voltage of a victim cell is performed considering a capacitive coupling between charge storage substances of a victim cell and an aggressor cell. In this case, the quantitative relationship between threshold voltages of a victim cell and an aggressor cell may be described by a straight line having a slope of S0 as indicated by a dotted line in FIG. 7. That is, a linear relation exists between the two threshold voltages.

However, according to a simulation experiment, as indicated by a solid line in FIG. 7, the relationship between a threshold voltage of the victim cell and a threshold voltage of the aggressor cell changed to be nonlinear. That is, threshold voltage slope S2 is greater than threshold voltage slope S1 and threshold voltage slope S1 is greater than threshold voltage slope S0. The nonlinearity of the threshold voltage may cause an enlargement of program distribution of a memory device and an erroneous operation of reading data of a memory cell. That is, since a data state of a memory device is determined by a result of read operation, if a read operation is performed without considering a nonlinearity of the threshold voltage of the victim cell, the nonlinearity of the threshold voltage of the victim cell can result in the enlargement of program distribution of a memory device and an erroneous operation of reading data of a memory cell. That is, the enlargement of voltage levels in the memory cell that yield desired bit information can result in bit information errors.

The nonlinearity of the threshold voltage of the victim cell can be understood by a result of a nonlinear relation between the CS-CH coupling and an impurity concentration of the source/drain region S/D which was described with reference to FIG. 5. The nonlinearity can be understood by an analysis of FIGS. 8 and 9 illustrating a different simulation experiment result.

Figure 8:
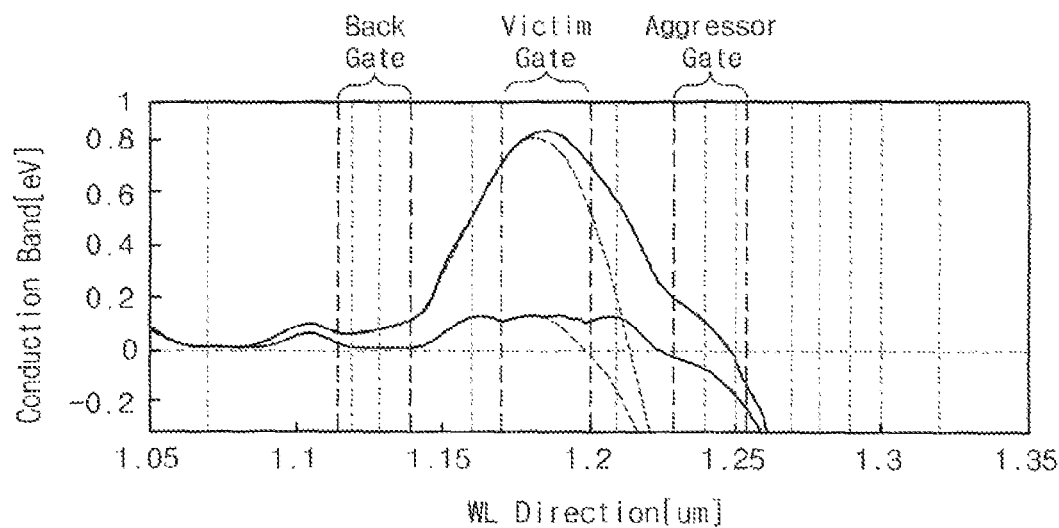
FIGS. 8 and 9 are graphs showing a simulation result on an electric potential barrier property of a memory cell string.
Figure 9:
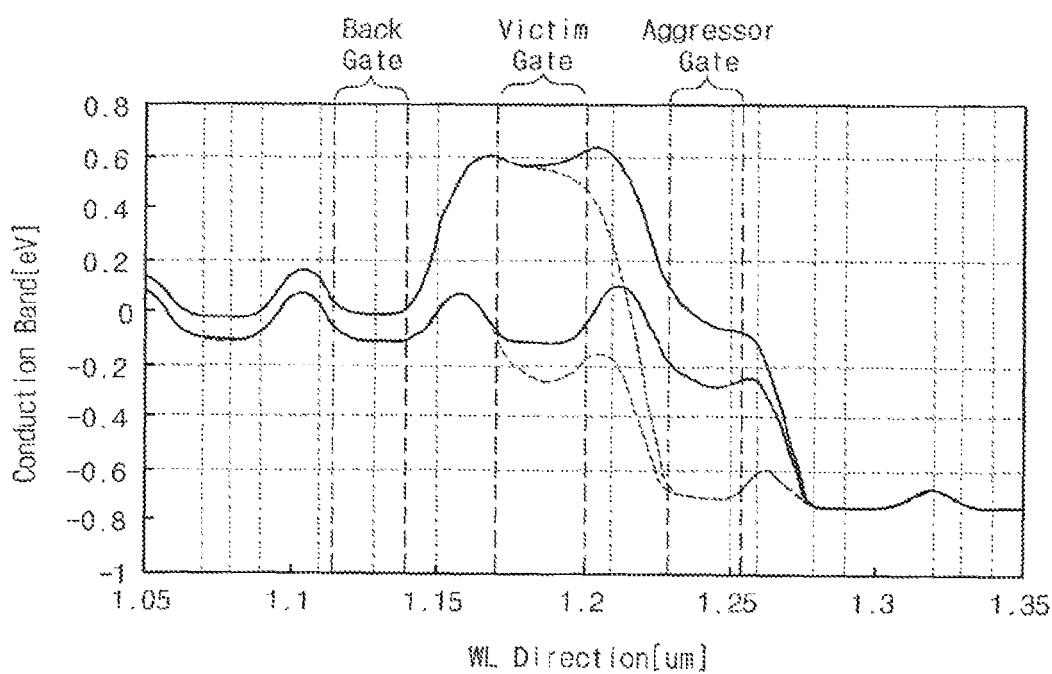

FIGS. 8 and 9 are graphs showing a simulation result on an electric potential barrier property of a string. More specifically, FIGS. 8 and 9 show results that calculated conduction band of a semiconductor layer in a lengthwise direction of a string (e.g., a direction along the dotted line I-I' of FIG. 6) with respect to the cases of having doping profiles of FIGS. 4A and 4E, respectively. That is, FIG. 8 is a simulation result for the case that the source/drain region is highly doped with an impurity having different conductivity type than the channel and FIG. 9 is a simulation result for the case that the source/drain region has the same conductivity type as the channel. In the simulation result, the case that the aggressor cell is in an erasure state is indicated by a dotted line and the case that the aggressor cell is in a program state is indicated by a solid line.

As illustrated in FIG. 9, in the case where an impurity concentration of the source/drain region becomes low or has the same conductivity type as the channel region, the source/drain region of the victim cell adjacent to the aggressor cell has a rapidly increased conduction band level. The change of electric potential barrier can be understood by a result of the CS-CH coupling described with reference to FIG. 5. That is, the change of electric potential barrier may be a result of the storage induced barrier change (SIBC) phenomenon which means a change of an electric potential of source/drain region of the victim cell is caused by electrons injected into a charge storage substance of the aggressor cell.

FIGS. 10 through 16 are graphs showing read operation methods or program verifying operation methods of a semiconductor device in accordance with exemplary embodiments of the inventive concept. In the graphs, a horizontal axis indicates positions of word lines forming a string described with reference to FIGS. 2 and 3 and a vertical axis indicates amplitude of a voltage applied to the word lines. In an exemplary embodiment a common source line is located on the left of the word lines and a bit line plug is located on the right of the word lines. For convenience of description, WL$_i$ is called a selected word line and the other word lines are called an unselected word line. Word lines WL$_{i-1}$ and WL$_{i+1}$ adjacent to the selected word line WL$_i$ left and right are called a left adjacent word line and a right adjacent word line, respectively.

Figure 10:
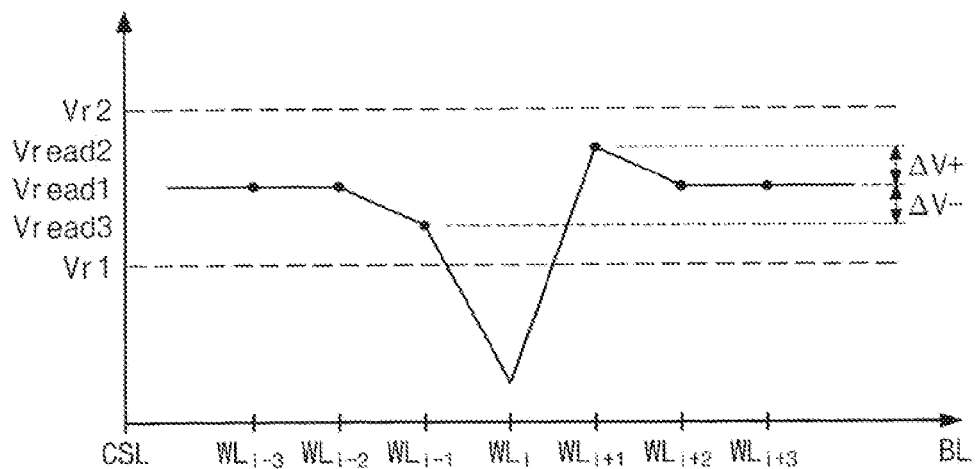
FIGS. 10, 11, 12, 13, 14, 15 and 16 are graphs showing read operation methods or program verifying operation methods of a semiconductor device in accordance with exemplary embodiments of the inventive concept.
Figure 11:
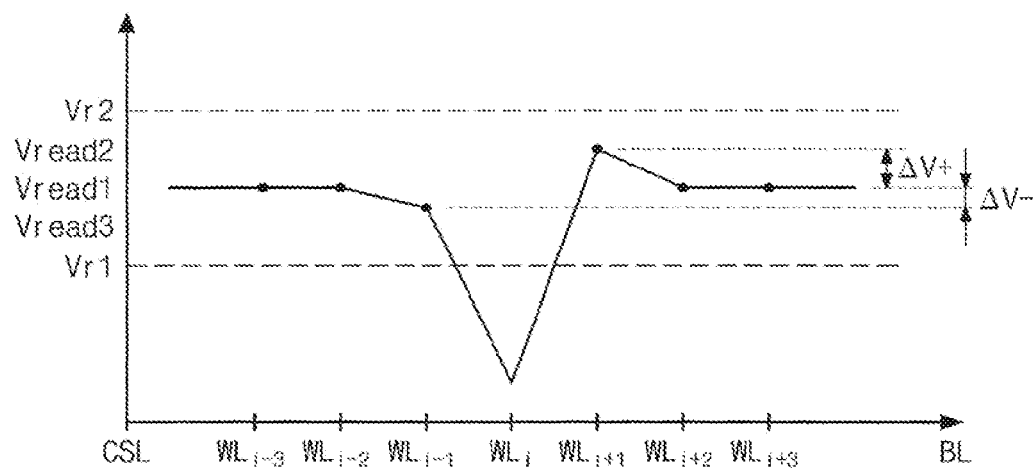

According to exemplary embodiments of the inventive concept, as illustrated in FIGS. 10 through 15, three read voltages having different magnitude from one another may be applied to word lines. More specifically, according to an exemplary embodiment, as illustrated in FIGS. 10 and 11, a third read voltage Vread3 is applied to the left adjacent word line $WL_{i-1}$ and a second read voltage Vread2 higher than the third read voltage Vread3 is applied to the right adjacent word line $WL_{i+1}$. A first read voltage Vread1 between the second and third voltages Vread2 and Vread3 is applied to the unselected word lines $WL_{i-3}$, $WL_{i-2}$, $WL_{i+2}$ and $WL_{i+3}$. A difference (ΔV+) between the first read voltage Vread1 and the second read voltage Vread2 may be equal to a difference (ΔV−) between the first read voltage Vread1 and the third read voltage Vread3 as illustrated in FIG. 10. A difference (ΔV+) between the first read voltage Vread1 and the second read voltage Vread2 may be different from a difference (ΔV−) between the first read voltage Vread1 and the third read voltage Vread3 as illustrated in FIG. 11.

Figure 12:
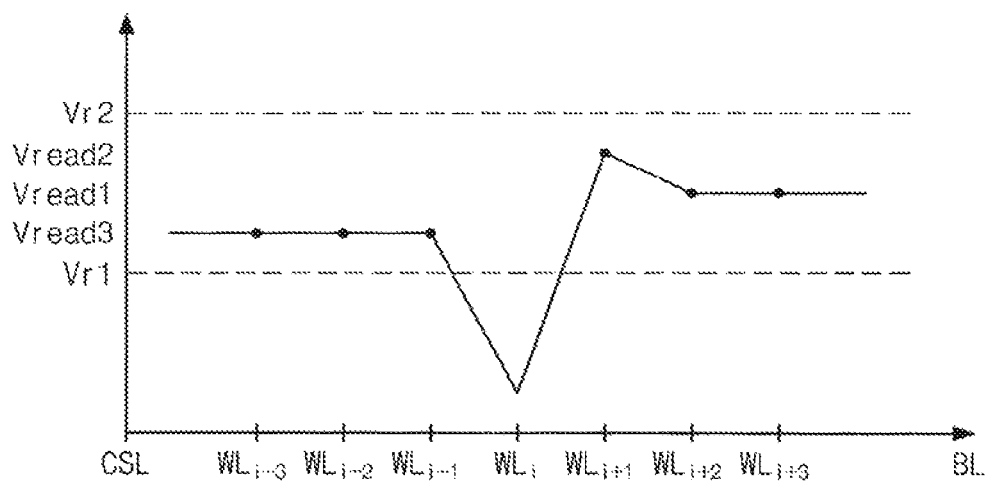
Figure 13:
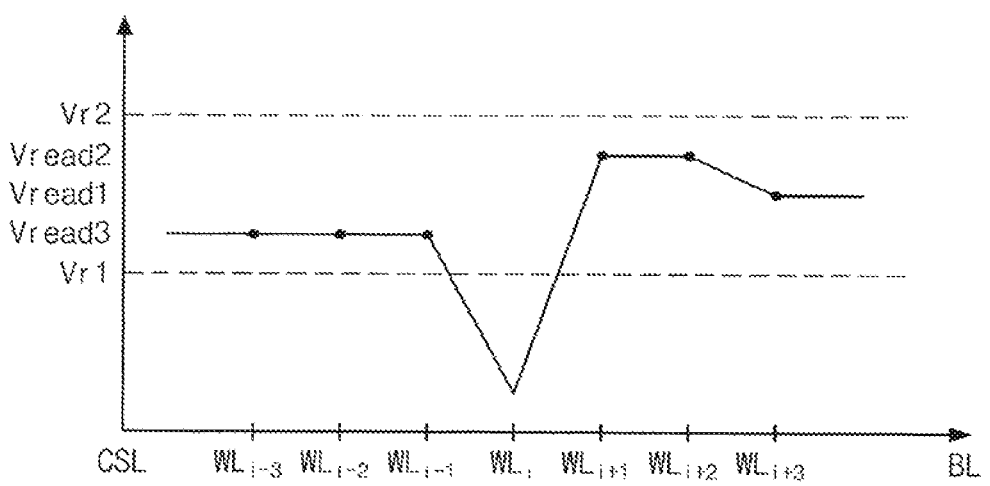
Figure 14:
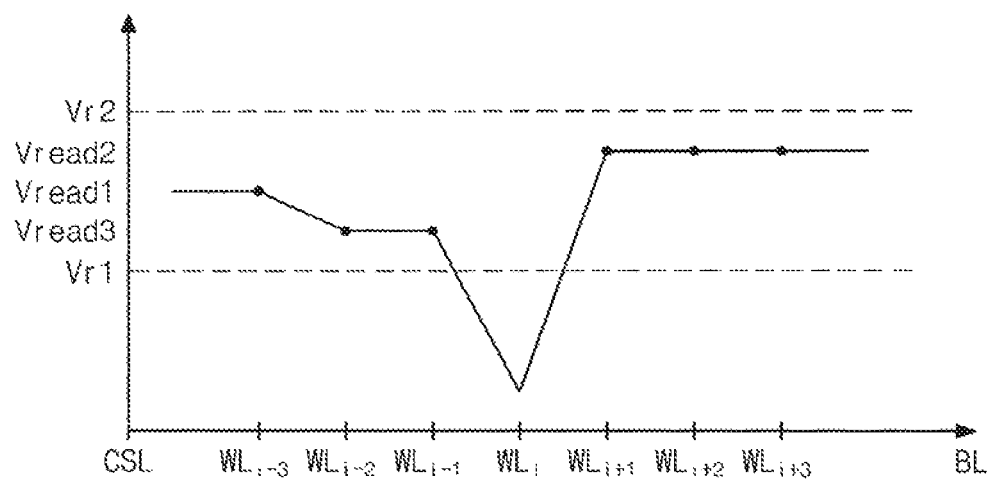
Figure 16:
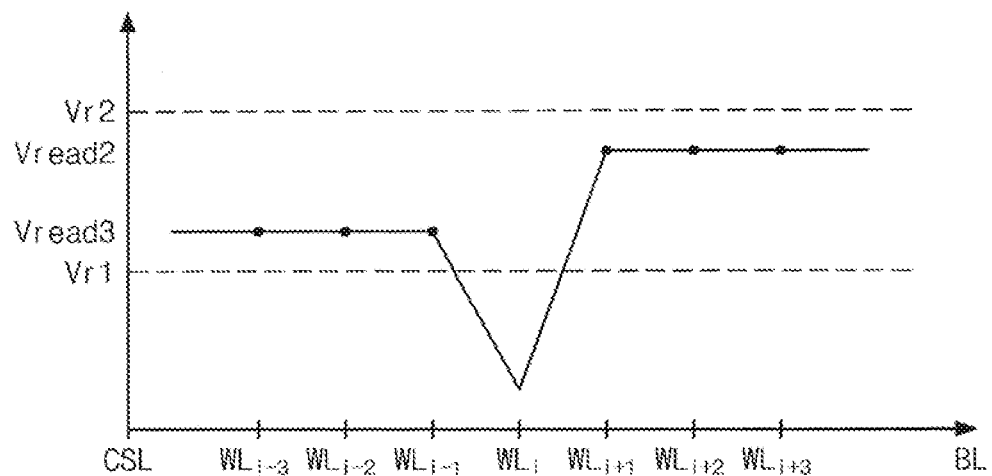

According to an exemplary embodiment, a same voltage (i.e., Vread3) may be applied to unselected word lines $WL_{i-3}$, $WL_{i-2}$ and $WL_{i-1}$ disposed between the selected word line $WL_i$ and a common source line CSL as illustrated in FIGS. 12, 13 and 16. According to an exemplary embodiment, a same voltage (i.e., Vread2) may be applied to unselected word lines $WL_{i+3}$, $WL_{i+2}$ and $WL_{i+1}$ disposed between the selected word line $WL_i$ and a bit line BL as illustrated in FIGS. 14 and 16.

Figure 15:
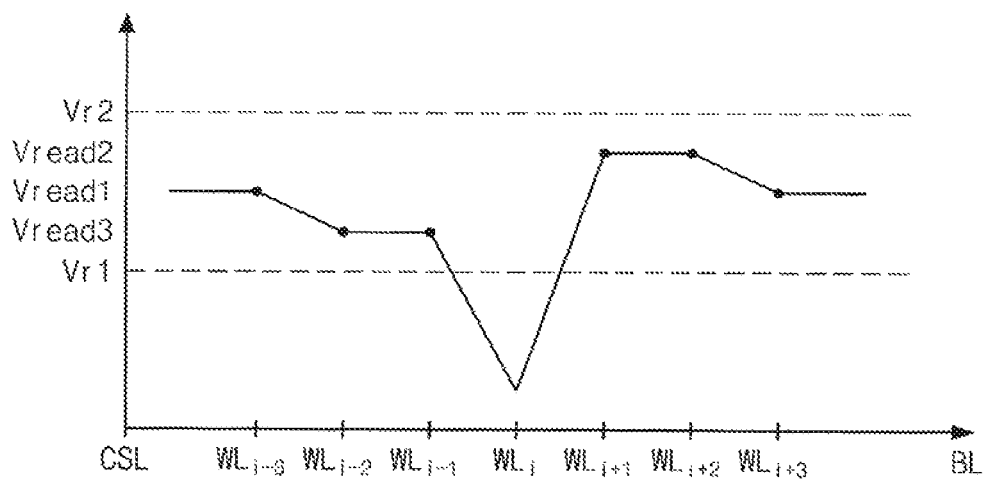

According to an exemplary embodiment, as illustrated in FIGS. 13 and 15, a voltage having the same amplitude as the right adjacent word line $WL_{i+1}$ is applied to at least one unselected word line (e.g., $WL_{i+2}$) disposed between the right adjacent word line $WL_{i+1}$ and the bit line BL and a voltage having a different amplitude from the right adjacent word line $WL_{i+1}$ is applied to at least the other unselected word line (e.g., $WL_{i+3}$) disposed between the right adjacent word line $WL_{i+1}$ and the bit line BL. Similarly, as illustrated in FIG. 15, a voltage having the same amplitude as the left adjacent word line $WL_{i11}$ is applied to at least one unselected word line (e.g., $WL_{i22}$) disposed between the left adjacent word line $WL_{i+1}$ and the common source line CSL and a voltage having a different amplitude from the left adjacent word line $WL_{i-i}$ is applied to at least the other unselected word line (e.g., $WL_{i-3}$) disposed between the left adjacent word line $WL_{i-1}$ and the common source line CSL.

According to an exemplary embodiment of the inventive concept, the two voltages Vread1, Vread2 having different amplitude from each other may be applied to word lines. For example, as illustrated in FIG. 16, the third read voltage Vread3 may be applied to the unselected word lines $WL_{i-3}$, $WL_{i-2}$, $WL_{i-1}$ disposed between the selected word line $WL_i$ and the common source line CSL and the second read voltage Vread2 may be applied to the unselected word lines $WL_{i+3}$, $WL_{i+2}$ and $WL_{i+1}$ disposed between the selected word line $WL_i$ and the bit line BL.

The first through third read voltages Vread1, Vread2, Vread3 may have values between a first voltage Vr1 and a second voltage Vr2 while having different values from one another. According to an exemplary embodiment, the first voltage Vr1 may be a minimum voltage that can turn on a cell of a program state and the second voltage Vr2 may be a maximum voltage that can prevent an unintended program from occurring in a cell of an erasure state.

According to one aspect of the inventive concept, as illustrated in FIGS. 10 through 16, while a read operation is performed, a voltage Vread2 applied to the right adjacent word line $WL_{i+1}$ may be the maximum voltage among all the voltages applied to word lines forming a string. According to the other aspect of the inventive concept, as illustrated in FIGS. 10 through 16, while a read operation is performed, a voltage Vread3 applied to the left adjacent word line $WL_{i-1}$ may be the minimum voltage among all the voltages applied to word lines forming a string except the selected word line $WL_i$.

Figure 17:
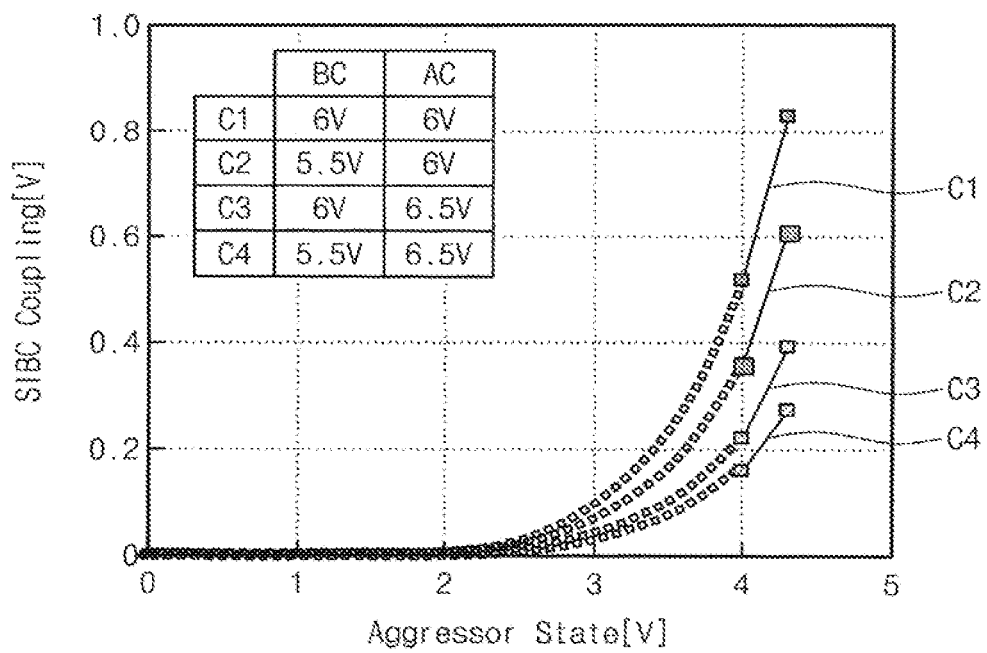
FIG. 17 is a graph showing a simulation result on storage induced barrier change (SIBC) phenomenon in read operations of a semiconductor device in accordance with exemplary embodiments of the inventive concept.

FIG. 17 is a graph showing a simulation result on SIBC phenomenon as discussed above in read operations of a semiconductor device in accordance with some embodiments of the inventive concept. In the graph, as the SIBC coupling illustrated in a vertical axis increases, a change of threshold voltage of the victim cell increases. In the simulation, voltages applied to the back cell (BC) and to the aggressor cell (AC) are split into four cases as illustrated in a table of the graph. That is, a word line voltage of the back cell is split into two voltages of 6V and 5.5V and a word line voltage of the aggressor cell is split into two voltages of 6V and 6.5V.

If, in the graph, comparing a curve C1 to a curve C3 or comparing a curve C2 to a curve C4, as a voltage applied to a word line of the aggressor cell increases, the SIBC coupling decreases. Also, if, in the graph, comparing a curve C1 to a curve C2 or comparing a curve C3 to a curve C4, as a voltage applied to a word line of the back cell decreases, the SIBC coupling decreases. Consequently, the SIBC coupling may be reduced when satisfying one of the following two conditions and may be minimized when satisfying all of the following two conditions.

1. An increase of a word line voltage of the aggressor cell (AC).
2. A decrease of a word line voltage of the back cell (BC).

As described with reference to FIGS. 10 through 16, according to embodiments of the inventive concept, while a read operation is performed, the Vread2 may be applied to the right adjacent word line $WL_{i+1}$ which is a maximum voltage among voltages applied to word lines forming a string. In the way that the right adjacent word line $WL_{i+1}$ functions as a word line of the aggressor cell, the first condition for a decrease of the SIBC coupling can be satisfied. Also, while a read operation is performed, the Vread3 may be applied to the left adjacent word line $WL_{i-1}$ which is a minimum voltage among voltages applied to word lines forming a string except the selected word line $WL_1$. In the way that the left adjacent word line $WL_{i-1}$ functions as a word line of the back cell, the second condition for a decrease of the SIBC coupling can be satisfied.

Figure 18:
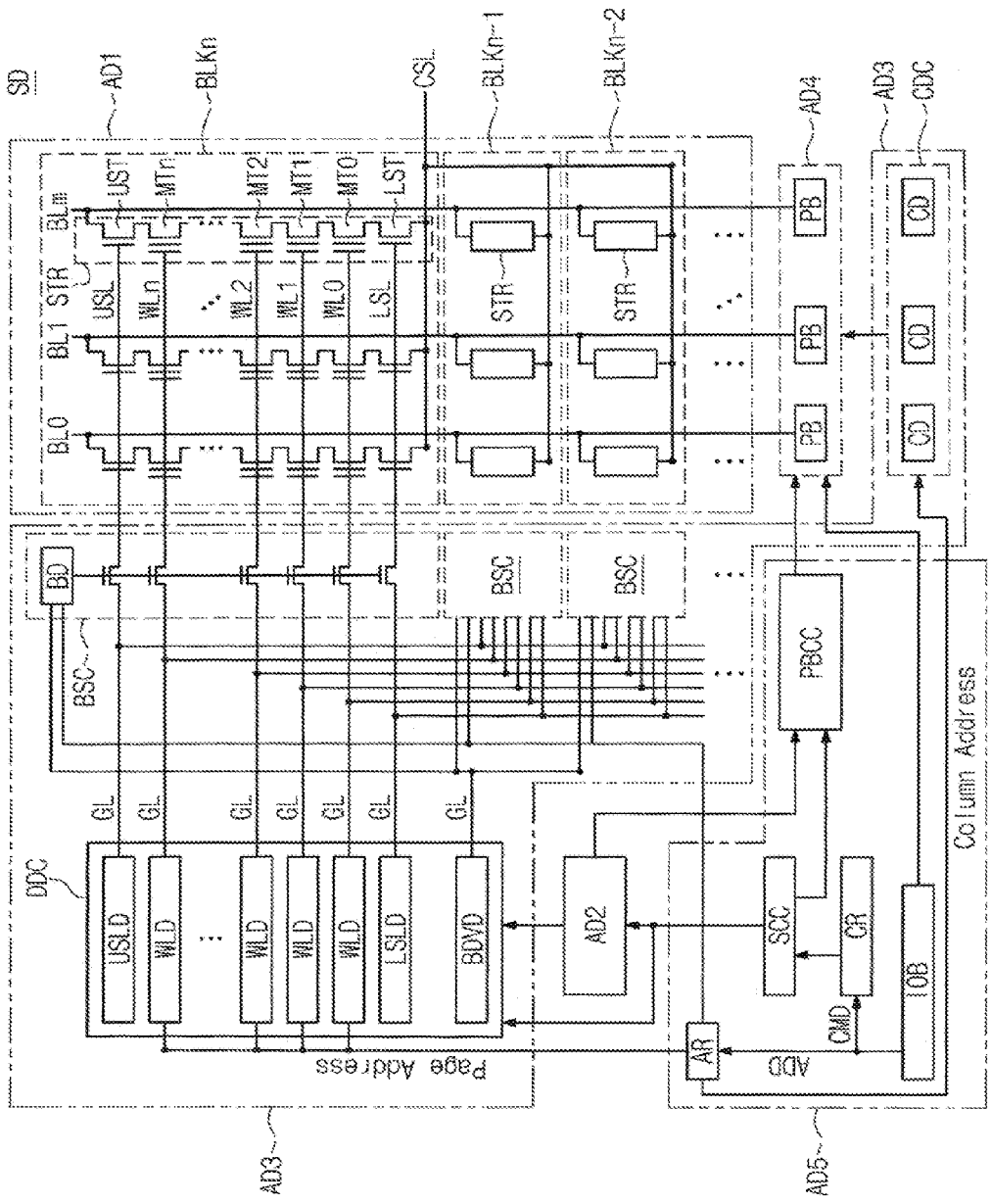
FIG. 18 is a block diagram illustrating a semiconductor device in accordance with an exemplary embodiment of the inventive concept.

FIG. 18 is a block diagram illustrating a semiconductor device in accordance with an exemplary embodiment of the inventive concept. More specifically, the semiconductor device illustrated in FIG. 18 may be an exemplary embodiment of the semiconductor device described with reference to FIG. 1 and configured to realize the read operation described with reference to FIGS. 10 through 16. However, exemplary embodiments the inventive concept may not only be realized through only the embodiments illustrated in the drawings. Other embodiments configured to realize the read operation described with reference to FIGS. 10 through 16 can be implemented.

Referring to FIG. 18, a cell array AD1 may include a plurality of blocks BLKn BLKn-1, BLKn-2, . . . configured to have a NAND type cell array structure. That is, each of the blocks BLK may include a plurality of gate lines and a plurality of bit lines BL0-BLm crossing the gate lines. The gate lines may include at least one upper select line USL, at least one lower select line LSL and a plurality of word lines WL0-WLn disposed between the lower select line LSL and the lower select line LSL that are used as gate electrodes of select transistors and memory cell transistors. In addition, the blocks BLK can share a common source line CSL and a plurality of stings STR having one end connected to one of the bit lines BL can be commonly connected to the common source line CSL.

Figure 19:
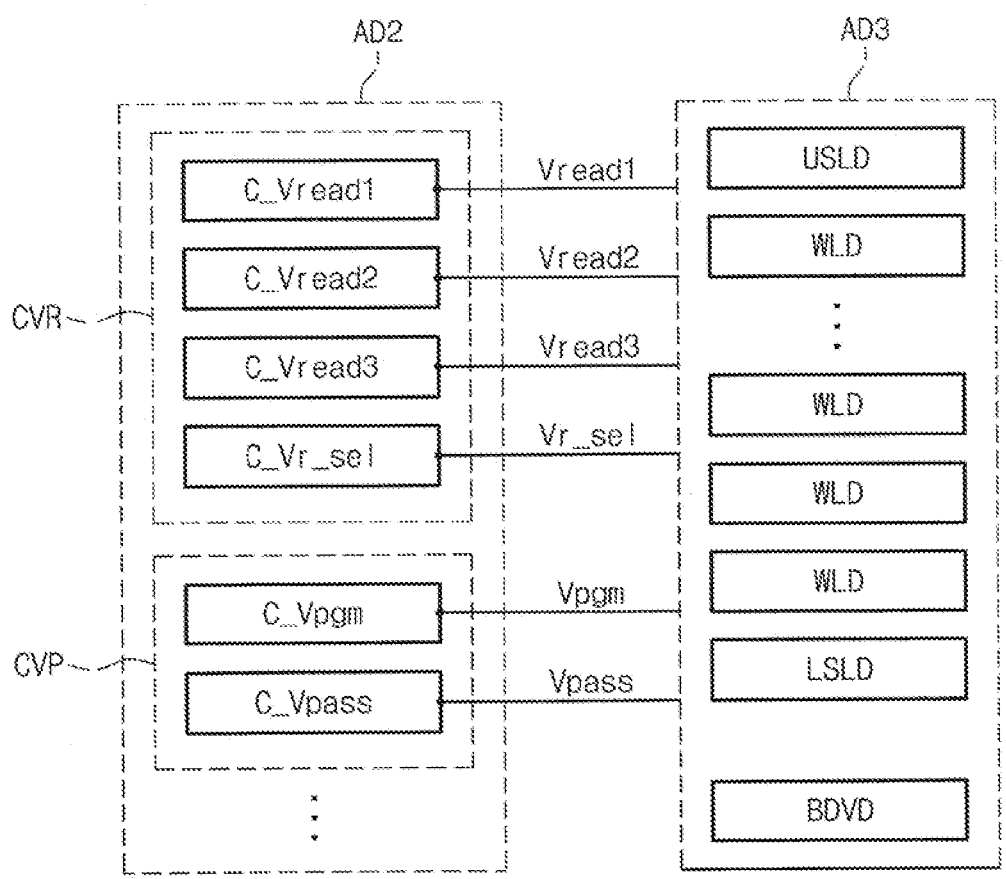
FIG. 19 is a block diagram for describing a signal generator and a coupler of a semiconductor device in accordance with an exemplary embodiment of the inventive concept.

According to an exemplary embodiment, a signal generator AD2, as illustrated in FIG. 19, may include circuits generating various voltages required for program, read and erasure operations.

A read/writing circuit AD4 may include page buffers connected to the bit lines BL respectively. Each of the page buffers may receive operation voltages from the signal generator AD2 through a page buffer control circuit (PBCC) and the PBCC may be controlled by a sequence control circuit (SCC).

A coupler AD3 may include a row decoder and a column decoder circuit CDC. The row decoder may include a decoding and driving circuit DDC and a block select circuit BSC. In an exemplary embodiment, the decoding and driving circuit DDC may be configured to perform a decoding and driving function transferring voltages generated from the signal generator AD2 to global lines GL in response to a page address of a control logic AD5. The block select circuit BSC may be configured to selectively connect the global lines GL to one of the blocks BLK in response to a block address of the control logic AD5. According to one aspect, the block select circuit BSC may be defined as a row decoder in a narrow sense. The column decoder circuit CDC may include column decoders CD configured to select the bit lines BL or the page buffers PB in response to a column address of the control logic ADS.

The control logic ADS may include an input/output buffer IOB, an address register AR, a command register CR, a sequence control circuit SCC and a page buffer control circuit PBCC. A specific operation of the semiconductor device can be performed by receiving a corresponding command CMD and corresponding address information ADD through the input/output buffer IOB. The command CMD is latched onto the command register CR controlling the sequence control circuit SCC. The sequence control circuit SCC is configured to handle a series of control processes for performing a corresponding operation. For example, operations of the signal generator AD2 and the page buffer control circuit PBCC may be controlled by the sequence control circuit SCC. The address information ADD may include a page address transferring to the decoding and driving circuit DDC, a block address transferring to the block select circuit BSC and a column address transferring to the column decoder circuit CDC.

Figure 20:
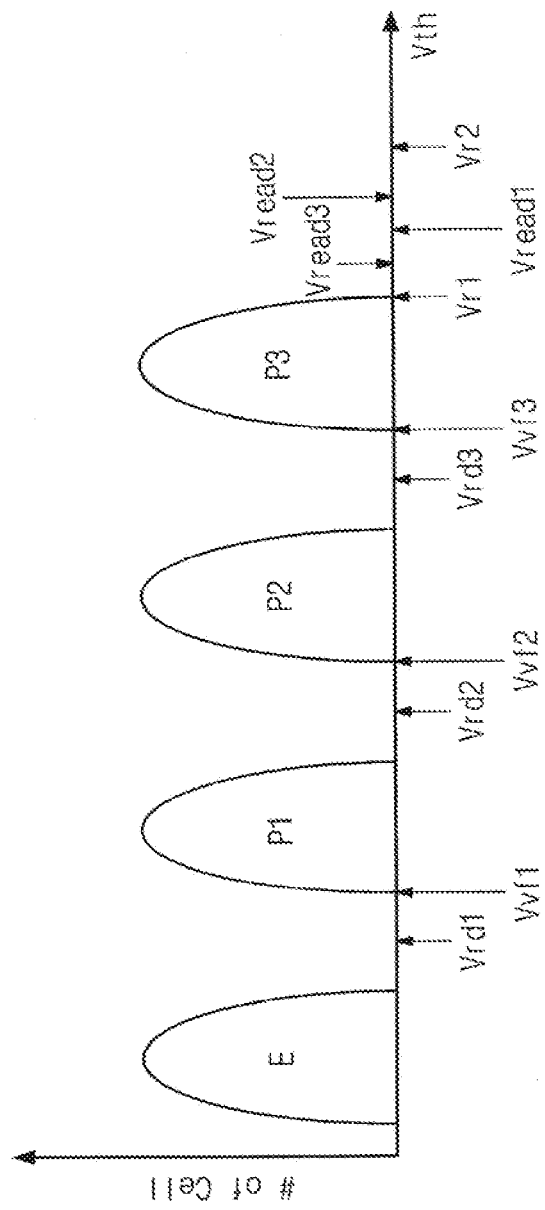
FIG. 20 is a diagram illustrating a distribution of threshold voltage of memory cell of a semiconductor device in accordance with an exemplary embodiment of the inventive concept.

FIG. 19 is a block diagram for describing a signal generator AD2 and a coupler AD3 of a semiconductor device in accordance with an exemplary embodiment of the inventive concept in more detail. FIG. 20 is a diagram illustrating a distribution of threshold voltage of memory cell of a semiconductor device in accordance with an exemplary embodiment of the inventive concept.

Referring to FIG. 19, the signal generator AD2 may include a read voltage circuit CVR generating voltages for a read operation and a program voltage circuit CVP generating voltages for a program operation. The program voltage circuit CVP may include a program voltage generating circuit C_Vpgm configured to generate a program voltage Vpgm and a pass voltage generating circuit C_Vpass configured to generate a pass voltage Vpass.

According to an exemplary embodiment of the inventive concept, the read voltage circuit CVR may include first through third read voltage generating circuits C_Vread1, C_Vread2, C_Vread3 configured to generate first through third read voltages Vread1, Vread2, Vread3. As described with reference to FIGS. 10 through 16, the first through third read voltages Vread1, Vread2, Vread3 may have values between a first voltage Vr1 and a second voltage Vr2 while having different amplitudes from one another. As illustrated in FIG. 20, the first voltage Vr1 may be a minimum voltage that can turn on a cell of a program state and the second voltage Vr2 may be a maximum voltage that can prevent an unintended program from occurring in a cell of an erasure state. According to an exemplary embodiment, the signal generator AD2 may be configured to selectively be applied to the decoding and driving circuit DDC in which the first through third read voltages Vread1, Vread2, Vread3 are connected to the word lines WL.

In addition, the read voltage circuit CVR may further include a circuit C_Vr_sel generating a select read voltage Vr_sel. The select read voltage Vr_sel may be a voltage applied to the selected word line while a read step or a program verification step is performed. For example, the select read voltage Vr_sel may be a voltage applied to the word line marked with WLi in the case of the embodiments described with reference to FIGS. 10 through 16 and may be a voltage applied to the word line WL2 of victim cell in the case of the embodiment described with reference to FIG. 6.

As illustrated in FIG. 20, in the case where a memory cell may have one of a plurality of memory states E, P1, P2 and P3, the select read voltage Vr_sel may be first through third select read voltages Vrd1, Vrd2, Vrd3 and first through third program verification voltages Vvf1, Vvf2 and Vvf3 and the circuit C_Vr_sel may be configured to generate the plurality of voltages. According to an exemplary embodiment the first select read voltage Vrd1 has a voltage level between the erasure state E and the first program state P1 and the second select read voltage Vrd2 has a voltage level between the first and second program states P1, P2. The third select read voltage Vrd3 has a voltage level between the second and third program states P2, P3. Also, the first program verification voltage Vvf1 is a voltage for verifying programming of a memory cell into the first program state P1 and the second program verification voltage Vvf2 is a voltage for verifying programming of a memory cell into the second program state P2. The third program verification voltage Vvf3 is a voltage for verifying programming of a memory cell into the third program state P3.

Figure 21:
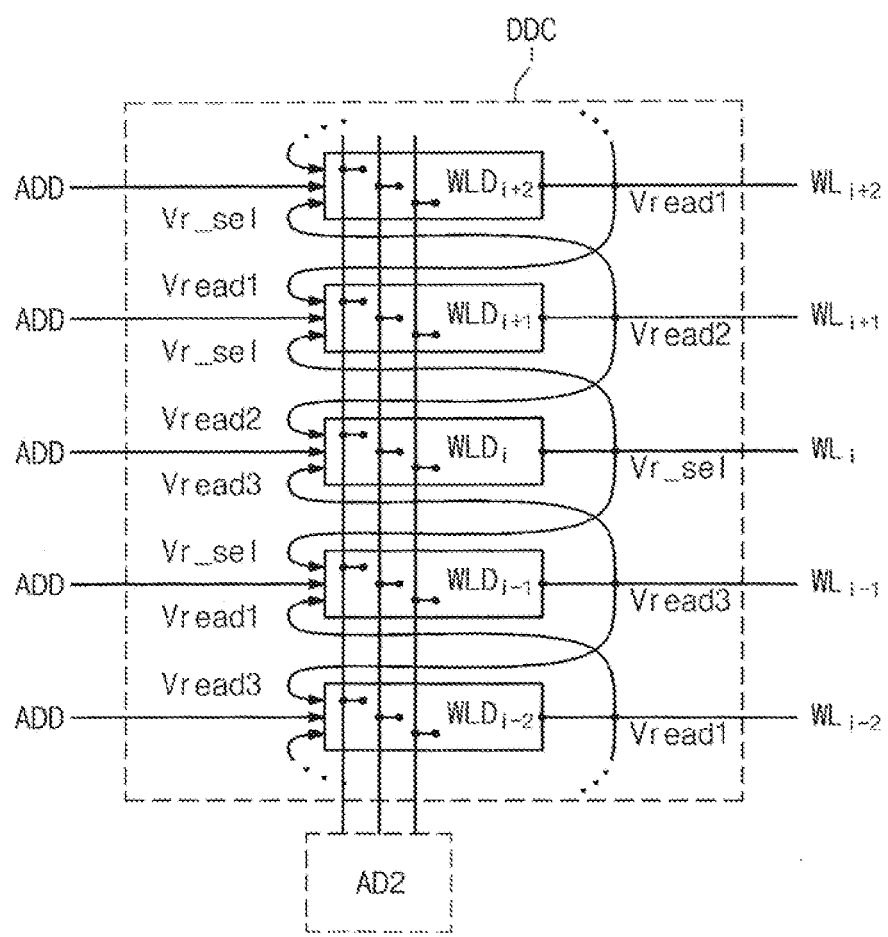
FIG. 21 is a drawing illustrating an example of a decoding and driving circuit that can realize a voltage applying method in accordance with exemplary embodiments of the inventive concept.

According to an exemplary embodiment of the inventive concept, the signal generator AD2 and the decoding and driving circuit DDC, in a read step or a program verification step, may be configured to realize a voltage applying method in accordance with one of the embodiments described with reference to FIGS. 10 through 16. Referring to FIG. 21, an exemplary embodiment that can realize the voltage applying method will be described below.

FIG. 21 is a drawing illustrating an example of a decoding and a driving circuit DDC that can realize a read operation described with reference to FIGS. 10 and 11.

Referring to FIG. 21, the decoding and driving circuit DDC may include word line decoding/driving circuits WLD connected to word lines WL. During a read step or a program verification step, each of the word line decoding/driving circuits WLD may be configured to transfer the select read voltage Vr_sel to the selected word line WLi corresponding to the address information ADD and may be configured to transfer the first through third read voltages Vread1, Vread2, Vread3 to the rest of the word lines (i.e., unselected word lines).

In addition, each of the word line decoding/driving circuits WLD may be configured so that an output voltage thereof is inputted into an adjacent pair of word line decoding/driving circuits WLD to control them. For example, in the case where a predetermined word line decoding/driving circuit WLD$_i$ outputs the select read voltage Vr_sel, the output voltage Vr_sel may be inputted into adjacent word line decoding/ driving circuits WLDi+1, WLDi−1 and the adjacent word line decoding/driving circuits WLDi+1, WLDi−1 may be configured to output the second and third read voltages Vread2, Vread3 in response to that input voltage Vr_sel.

The methods of applying a voltage in a read step or a program verification step described with reference to FIGS. 10 through 16 may not be realized through only the construction or a modification thereof described with reference to FIGS. 21. For example, the word line decoding/driving circuit WLD may be configured to determine an output voltage on the basis of the address information ADD (e.g., a difference between addresses).

Figure 22:
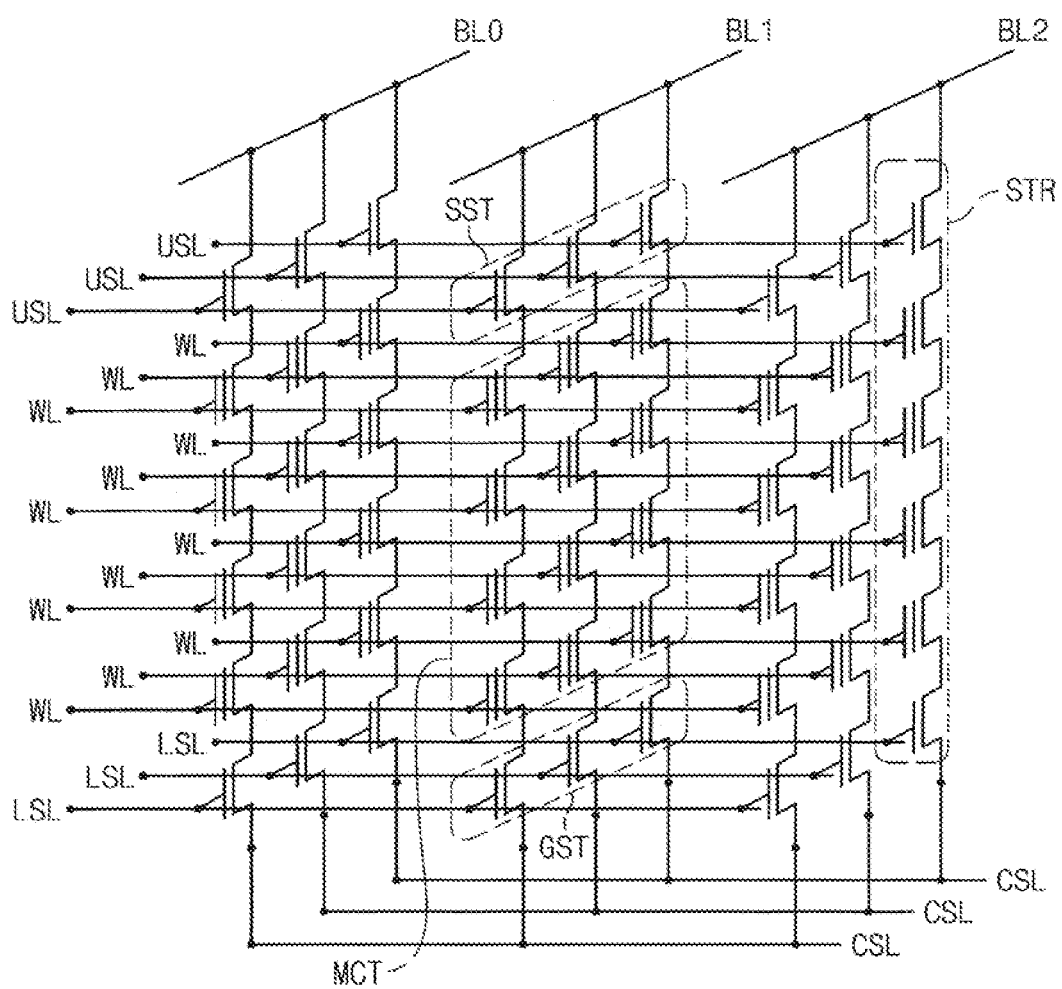
FIG. 22 is a circuit diagram illustrating a portion of a cell array of a semiconductor device in accordance with an exemplary embodiment of the inventive concept.

FIG. 22 is a circuit diagram illustrating a portion of cell array AD1 of a semiconductor device in accordance with an exemplary embodiment of the inventive concept.

Referring to FIG. 22, the cell array AD1 may include a common source line CSL, a plurality of bit lines BL0, BL1, BL2 and a plurality of cell strings STR disposed between the common source line CSL and the bit lines BL0, BL1, BL2.

The common source line CSL may be a conductive thin layer disposed on a substrate or an impurity region formed in the substrate. The bit lines BL0-BL2 may be conductive patterns (e.g., metal lines) disposed on the substrate while being spaced apart from the substrate. The bit lines BL0-BL2 are two-dimensionally arranged and a plurality of strings STR is connected to each of the bit lines BL0-BL2 in parallel. Thus, the strings STR are two-dimensionally arranged on the substrate.

Each of the strings STR may include a ground select transistor GST connected to the common source line CSL, a string select transistor SST connected to the bit lines BL0-BL2 and a plurality of memory cell transistors MCT disposed between the ground and string select transistors GST, SST. The ground select transistor GST, the string select transistor SST and the memory cell transistors MCT may be connected in series. In addition, ground select lines GSL, word lines WL and string select lines SSL disposed between the common source line CSL and the bit lines BL0-BL2 may be used as gate electrodes of the ground select transistor GST, the memory cell transistors MCT and the string select transistor SST, respectively.

According to the embodiment, each of the strings STR may include a semiconductor pattern perpendicular to the substrate. According to an exemplary embodiment, the semiconductor pattern may have a doping profile described with reference to FIG. 4C or FIG. 4F. During a read operation or a program verification operation, word line voltages corresponding to one of the embodiments described with reference to FIGS. 10 through 16 may be applied to the word lines WL.

Figure 23:
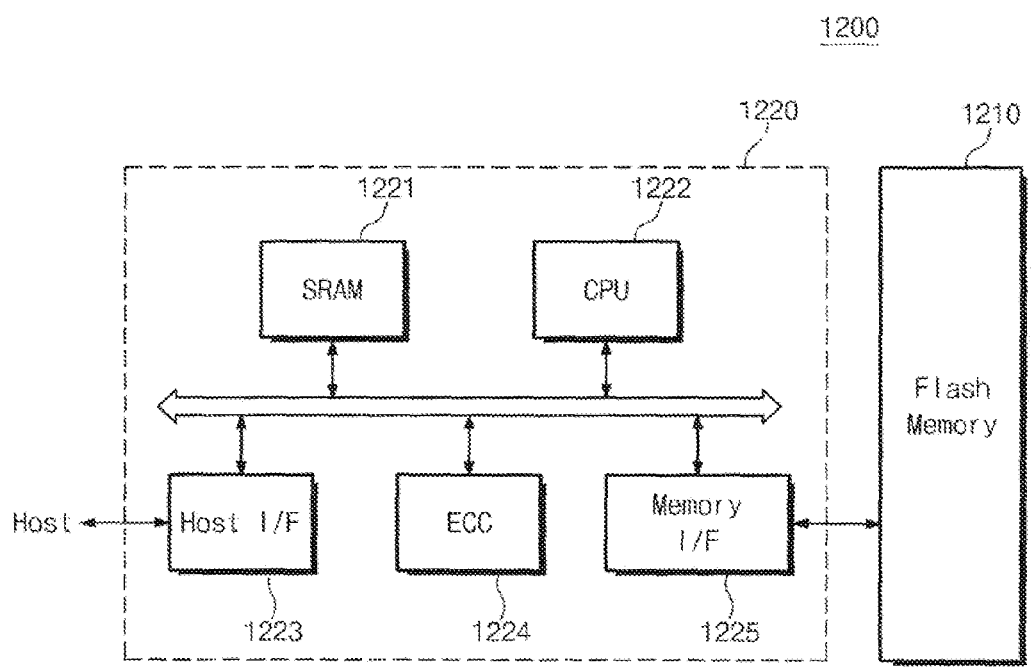
FIG. 23 is a block diagram illustrating an example of a memory card including a flash memory device in accordance with an exemplary embodiment of the inventive concept.

FIG. 23 is a block diagram illustrating a memory card 1200 including a flash memory device in accordance with an exemplary embodiment of the inventive concept. Referring to FIG. 23, the memory card 1200 for supporting a high data storage capacity includes a flash memory device. The memory card 1200 includes a memory controller 1220 controlling all the data changes between a host and the flash memory device 1210.

A static random access memory (SRAM) 1221 is used as an operation memory of the processing unit 1222. A host interface 1223 includes data exchange protocols connected to the memory card 1200. An error correction block 1224 detects and corrects an error included in data read from a multi-bit flash memory device 1210. The memory interface 1225 interfaces with the flash memory device 1210. A central processing unit (CPU) 1222 performs all the control operations for data exchange of the memory controller 1220. Although not illustrated in the drawing, the memory card 1200 may further include a read only memory (ROM) storing code data for interfacing with the host.

According to the exemplary embodiment of the flash memory device and the memory card or the memory system implementing the inventive concept, a memory system having high reliability can be provided through the flash memory device 1210 having an improved erasure characteristic of dummy cells. In particular, the flash memory device can be provided in a memory system such as a solid state drive (SSD). In this case, a memory system having high reliability can be realized by cutting off a read error caused by a dummy cell.

Figure 24:
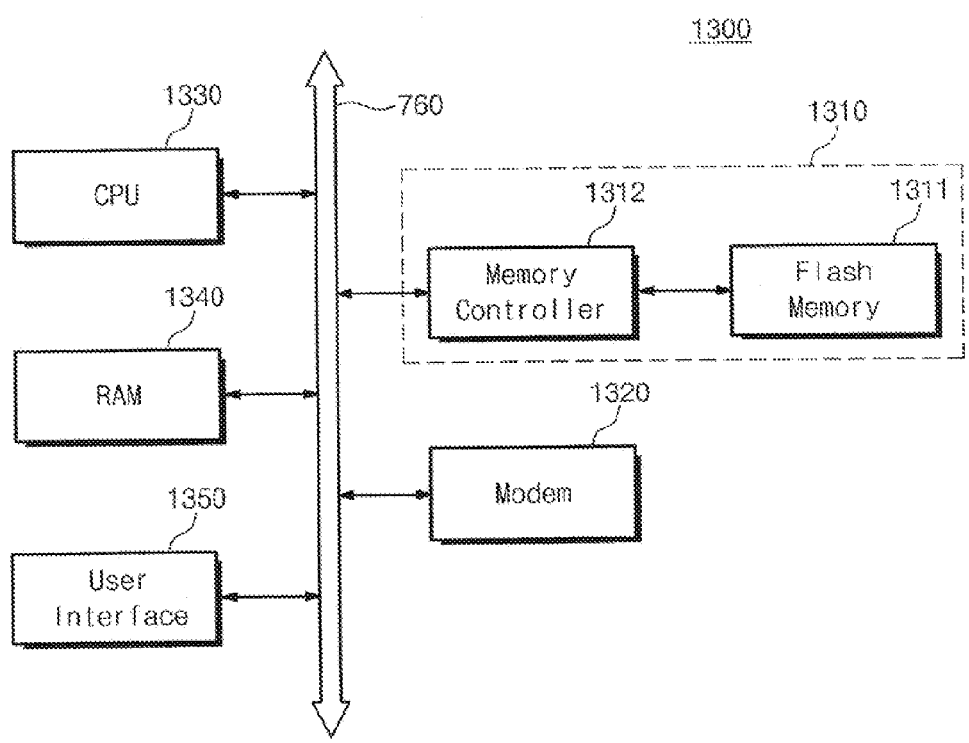
FIG. 24 is a block diagram illustrating an information processing system including a memory system in accordance with an exemplary embodiment of the inventive concept.

FIG. 24 is a block diagram illustrating an information processing system 1300 including a memory system 1310 in accordance with the inventive concept. Referring to FIG. 24, the memory system 1310 of the inventive concept is built in an information processing system such as a mobile device or a desk top computer. The information processing system 1300 in accordance with the inventive concept includes the flash memory system 1310 and a modern 1320, a central processing unit (CPU) 1330, a random access memory (RAM) 1340 and a user interface 1350 that are electrically connected to a system bus 1360. The flash memory system 1310 is constituted to be the same with the memory system or the flash memory system described before. The flash memory system 1310 stores data processed by the central processing unit 1330 and data received from the outside. Here, the flash memory system 1310 may be constituted by a solid state drive (SSD). In this case, the information processing system 1300 can stably store huge amounts of data in the flash memory system 1310. As reliability increases, the flash memory system 1310 can reduce resources required to correct an error, thereby providing a high speed data exchange function to the information processing system 1300. Although not illustrated in the drawing, the information processing system 1300 may further include an application chipset, a camera image processor (CIS) and an input/output device.

The flash memory device or the memory system in accordance with an exemplary embodiment of the inventive concept can be mounted with various types of packages. For example, the flash memory device or the memory system can be mounted by various types of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP) and mounted.

According to exemplary embodiments of the inventive concept, during a read step or a program verification step, read voltages having different voltage levels are applied to word lines disposed on both sides of the selected word line. According to the voltage applying methods, as described with reference to FIG. 17, a storage induced barrier change (SIBC) phenomenon may be suppressed wherein an electric potential of source/drain region of victim cell is changed by electrons injected into a charge storage substance of aggressor cell. Since the SIBC phenomenon is one of causes that can bring about a nonlinear change of threshold voltage of victim cell and an accompanying enlargement of program distribution, the voltage applying method in accordance with the embodiments of the inventive concept and an accompanying suppression of the SIBC phenomenon makes a suppression of program distribution enlargement possible.

The above-disclosed exemplary embodiments are to be considered illustrative, and not restrictive, and the following claims are intended to cover all such embodiments, modifications and enhancements of the exemplary embodiments, and other exemplary embodiments.

What is claimed is:

1. A semiconductor device, comprising:
at least one string including first and second impurity regions and memory cells serially connected between the first and second impurity regions;
a voltage generator configured to generate operation voltages;
a coupler configured to electrically connect the memory cells and the voltage generator; and
a common source line connected to the first impurity region and a bit line connected to the second impurity region,
wherein a source/drain region of the memory cell is different from at least one of the first and second impurity regions in at least one of a conductivity type and an impurity concentration,
wherein during a cell selecting step one of the memory cells is selected as a target cell, and the voltage generator and the coupler are configured to apply different voltages to gates of memory cells adjacent to both sides of the target cell,
wherein the memory cells comprise a left adjacent cell that is proximal to the target cell between the target cell and the first impurity region, and a right adjacent cell that is proximal to the target cell between the target cell and the second impurity region,
wherein during the cell selecting step, the voltage generator and the coupler are configured to apply a first voltage that is a maximum voltage level among voltages applied to gates of the memory cells, to the right adjacent cell,
wherein during the cell selecting step, the voltage generator and the coupler are configured to apply a second voltage that is a minimum voltage level among voltages applied to gates of the memory cells, to the left adjacent cell.
wherein during the cell selecting step, the voltage generator and the coupler are configured to apply the second voltage to at least one of gates of memory cells disposed between the first impurity region and the left adjacent cell and to a gate of the left adjacent cell.

2. The semiconductor device of claim 1, wherein during the cell selecting step, the voltage generator and the coupler are configured to apply a third voltage that is a voltage level between the first and second voltages, to at least one of gates of memory cells disposed between the first impurity region and the left adjacent cell and between the second impurity region and the right adjacent cell.

3. A semiconductor device, comprising:
at least one string including first and second impurity regions and memory cells serially connected between the first and second impurity regions;
a voltage generator configured to generate operation voltages;
a coupler configured to electrically connect the memory cells and the voltage generator; and
a common source line connected to the first impurity region and a bit line connected to the second impurity region,
wherein a source/drain region of the memory cell is different from at least one of the first and second impurity regions in at least one of a conductivity type and an impurity concentration,
wherein during a cell selecting step one of the memory cells is selected as a target cell, and the voltage generator and the coupler are configured to apply different voltages to gates of memory cells adjacent to both sides of the target cell,
wherein the memory cells comprise a left adjacent cell that is proximal to the target cell between the target cell and the first impurity region, and a right adjacent cell that is proximal to the target cell between the target cell and the second impurity region, and
wherein during the cell selecting step, the voltage generator and the coupler are configured to apply a first voltage that is a maximum voltage level among voltages applied to gates of the memory cells, to the right adjacent cell,
wherein during the cell selecting step, the voltage generator and the coupler are configured to apply the first voltage to at least one of gates of memory cells disposed between the second impurity region and the right adjacent cell and to a gate of the right adjacent cell.

4. The semiconductor device of claim 3, wherein the source/drain region of the memory cell has an impurity concentration lower than the first and second impurity regions.

5. The semiconductor device of claim 3, further comprising a substrate, wherein distances between the substrate and the memory cells forming one string are different from one another.

* * * * *